(12) United States Patent
Suzuki et al.

(10) Patent No.: US 8,501,673 B2
(45) Date of Patent: Aug. 6, 2013

(54) DLC-COATED MEMBER

(75) Inventors: Masahiro Suzuki, Kashiba (JP);
Toshiyuki Saito, Kashiba (JP);
Kazuyoshi Yamakawa, Nishinomiya (JP)

(73) Assignee: JTEKT Corporation, Osaka-shi (JP)

( * ) Notice: Subject to any disclaimer, the term of this patent is extended or adjusted under 35 U.S.C. 154(b) by 0 days.

(21) Appl. No.: 13/267,446

(22) Filed: Oct. 6, 2011

(65) Prior Publication Data

US 2012/0088701 A1    Apr. 12, 2012

(30) Foreign Application Priority Data

Oct. 12, 2010 (JP) ................................. 2010-229747

(51) Int. Cl.
*C10M 171/00* (2006.01)

(52) U.S. Cl.
USPC ......................................................... 508/509

(58) Field of Classification Search
USPC ......................................................... 508/509
See application file for complete search history.

(56) References Cited

U.S. PATENT DOCUMENTS

| 6,264,209 | B1 | 7/2001 | Miya et al. |
| 2008/0220257 | A1 | 9/2008 | Dekempeneer |
| 2010/0260994 | A1 | 10/2010 | Groenen et al. |
| 2010/0296883 | A1* | 11/2010 | Layyous ........................ 407/119 |

FOREIGN PATENT DOCUMENTS

| EP | 0 651 069 A1 | 5/1995 |
| JP | 2000-71103 | 3/2000 |
| JP | 2009-46757 | 3/2009 |
| JP | 2009046757 A * | 3/2009 |
| WO | WO 2007/020139 A1 | 2/2007 |
| WO | WO 2009/080610 A1 | 7/2009 |

OTHER PUBLICATIONS

The Extended European Search Report issued Dec. 29, 2011, in European Application No. / Patent No. 11184610.1-1215.
C. A. Charitidis, "Nanomechanical and nanotribological properties of carbon-based thin films: A review", International Journal of Refractory Metals and Flard Materials, Elsevier Publisher, vol. 28, No. 1 (XP026710392), Jan. 1, 2010, pp. 51-70.

* cited by examiner

*Primary Examiner* — Pamela H Weiss
*Assistant Examiner* — Taiwo Oladapo
(74) *Attorney, Agent, or Firm* — Oblon, Spivak, McClelland, Maier & Neustadt, L.L.P.

(57) ABSTRACT

A DLC-coated member (100) has a base (200), an intermediate layer (300) that covers the surface of the base (200), and a DLC film (400) that covers the surface of the intermediate layer (300). The intermediate layer (300) has a five-layer structure, constituted of a first intermediate layer (301), a second intermediate layer (302), a third intermediate layer (303), a fourth intermediate layer (304), and a fifth intermediate layer (305). The five layers (301 to 305) are made of DLC to which Si has been added. Among the layers (301 to 305), the Si concentration in the first intermediate layer (301) is the highest, and that in the fifth intermediate layer (305) is the second highest. The Si concentrations in the second intermediate layer (302), third intermediate layer (303), and fourth intermediate layer (304) are lower than those in the first intermediate layer (301) and fifth intermediate layer (305).

6 Claims, 3 Drawing Sheets

DLC-COATED MEMBER

INCORPORATION BY REFERENCE

The disclosure of Japanese Patent Application No. 2010-229747 filed on Oct. 12, 2010 including the specification, drawings and abstract, is incorporated herein by reference in its entirety.

BACKGROUND OF THE INVENTION

1. Field of the Invention

The invention relates to a DLC-coated member having a base that is coated, at least partially, with a DLC film.

2. Description of Related Art

In order to increase fuel economy of motor vehicles, reduction of the slide resistances of various slide parts mounted in motor vehicles is required. Therefore, in some cases, the surface of a base, which is a base member of a slide part, is coated, at least partially, with a DLC (Diamond Like Carbon) film that has low friction and high wear resistance (high hardness) (refer to Japanese Patent Application Publication No. 2000-71103). In general, the adhesion of a DLC film to a base is low. Therefore, there are demands for increasing the adhesion of a DLC film to a base.

For the purpose of increasing the adhesion of a DLC film, forming an intermediate layer constituted of a single layer film made of, for example, SiC between a base and a DLC film has been proposed, as described in Japanese Patent Application Publication No. 2000-71103.

However, even if an intermediate layer constituted of a single layer film, such as the one described in Japanese Patent Application Publication No. 2000-71103, is formed between a base and a DLC film, a sufficiently high adhesion of the DLC film to the base is not achieved. Meanwhile, another possible option for increasing the adhesion of a DLC film is to form a nitrided layer or a carburized layer on the surface of a base by performing a nitriding treatment (e.g., plasma nitridation) or a carburizing treatment (e.g., plasma carburization) before forming the DLC film.

However, in order to form a nitrided layer or a carburized layer that provides a sufficiently high adhesion, it is necessary to perform a nitriding treatment or a carburizing treatment in a high temperature environment. This narrows the range of choice for the material of a base. Therefore, in order to increase the adhesion of a DLC film to a base while securing a sufficiently wide range of choice for the material of the base, it is necessary to form an appropriate intermediate layer between the base and the DLC film.

SUMMARY OF THE INVENTION

It is an object of the invention to provide a DLC-coated member having a base, a DLC film, and an intermediate layer that is formed between the base and the DLC film to increase the adhesion of the DLC film to the base.

An aspect of the invention relates to a DLC-coated member that has a base of which a surface is coated, at least partially, with a DLC film, and that includes an intermediate layer that is formed between the base and the DLC film. The intermediate layer has a multi-layer structure formed by laminating three or more layers that are made of DLC to which a predetermined element has been added. The three or more layers include a first layer, a second layer, and a third layer that are formed in this order from the base side. Each of a concentration of the added element in the first layer and a concentration of the added element in the third layer is higher or lower than a concentration of the added element in the second layer.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
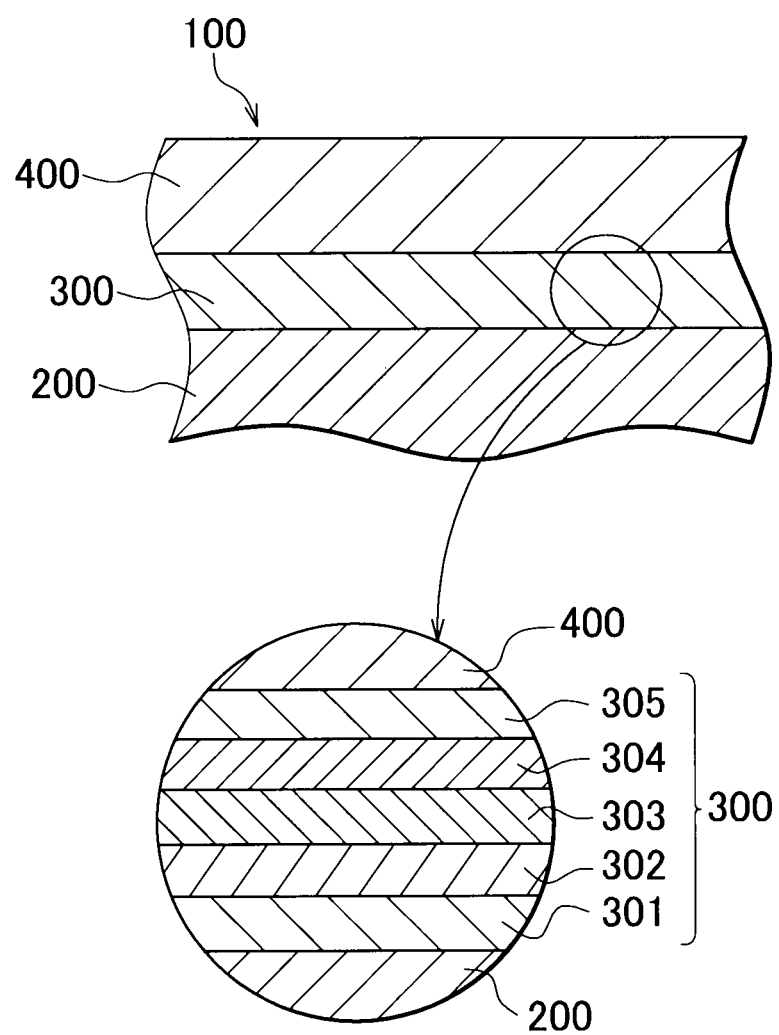
FIG. 1 is a sectional view schematically showing a surface layer portion of a DLC-coated member according to an example embodiment of the invention.

FIG. 1 is a sectional view schematically showing a surface layer portion of a DLC-coated member according to an example embodiment of the invention. Referring to FIG. 1, a DLC-coated member 100 is used, for example, as a slide part or a decorative part. The slide part may be, for example, a clutch plate of a frictional clutch, a worm gear of a steering system (a DLC film is formed on the tooth surfaces), an inner or outer ring of a bearing (a DLC film is formed on the raceway surface), a cage of a bearing, and a propeller shaft (a DLC film is formed on a drive shaft, and at least one of external and internal splines).

The DLC-coated member 100 has a base 200, an intermediate layer 300 that covers the surface of the base 200, and a DLC film 400 that covers the surface of the intermediate layer 300. The intermediate layer 300 and the DLC film 400 are thin films each having a thickness of several μm to several tens of μm. The surface of the DLC film 400 forms at least part of the outermost surface of the DLC-coated member 100. In a case where the DLC-coated member 100 is used as a slide part, the surface of the DLC film 400 serves as a slide face on which another part slides relative to the DLC-coated member 100. In a case where the DLC-coated member 100 is used as a slide part, the material of the base 200 is selected, for example, from among tool steel, carbon steel, stainless steel, and chrome molybdenum steel.

The intermediate layer 300 has a five-layer structure, constituted of a first intermediate layer 301 (an example of "first layer") that covers the surface of the base 200, a second intermediate layer 302 that covers the surface of the first intermediate layer 301, a third intermediate layer 303 (an example of "second layer") that covers the surface of the second intermediate layer 302, a fourth intermediate layer 304 that covers the surface of the third intermediate layer 303, and a fifth intermediate layer 305 (an example of "third layer") that covers the surface of the fourth intermediate layer 304. The layers 301 to 305 are each made of DLC to which silicon (Si) (an example of "a predetermined element") has been added.

The intermediate layer 300 and the DLC film 400 are formed by, for example, the direct current pulse plasma CVD (Chemical Vapor Deposition) method. In the direct current pulse plasma CVD method, voltage is intermittently applied to the base 200. Therefore, the possibility of abnormal electric discharges, which leads to an increase in the temperature of the base 200, is lower than that in the direct current plasma CVD method in which voltage is continuously applied to the base 200. Thus, the intermediate layer 300 and the DLC film 400 are formed with the temperature of the base 200 maintained at a low temperature (e.g., 300° C. or lower). Thus, the range of choice for the material of the base the base 200 is wider than that when the intermediate layer 300 and DLC film 400 are formed by the direct current plasma CVD method.

A first example embodiment will be described below. The concentrations of Si contained in the layers 301 to 305 (will hereinafter be referred to as "Si concentration") are different from each other. Among the five layers 301 to 305, the Si concentration in the first intermediate layer 301 is the highest, and the Si concentration in the fifth intermediate layer 305 is the second highest. The Si concentrations in the second intermediate layer 302, third intermediate layer 303, and fourth intermediate layer 304 are lower than each of the Si concentrations in the first intermediate layer 301 and fifth intermediate layer 305. Note that the Si concentration (Si/(Si+C)) in the first intermediate layer 301 is, for example, approximately 25 to 30 at. %.

The concentration of hydrogen (H) contained in DLC (will hereinafter be referred to "H concentration") is different among the layers 301 to 305. Among the five layers 301 to 305, the H concentration in the third intermediate layer 303 is the highest, and the H concentrations in the fourth intermediate layer 304 and fifth intermediate layer 305 are the second highest and thus are substantially equal to each other. The H concentration in the first intermediate layer 301 is the third highest next to each of the fourth intermediate layer 304 and the fifth intermediate layer 305. The H concentration in the second intermediate layer 302 is the lowest. Note that the H concentration (H/(H+C)) in the first intermediate layer 301 is, for example, approximately 25 to 30 at. %.

Table 1 shows the Si concentration, H concentration, hardness, and thickness of each of the layers 301 to 305. In Table 1, these characteristics (Si concentration, H concentration, hardness, and thickness) of each layer are expressed in comparative values using the values of the first intermediate layer 301 as references (which are all set to 1). The Si concentration and H concentration are each represented as a mole fraction. Further, it is to be noted that each numerical range indicated by two values (p and q) in Table 1 represents a range of given values larger than p but smaller than q. That is, for example, "0.7~0.9" in the cell for the Si concentration in the second intermediate layer 302 represents that the Si concentration in the second intermediate layer 302 is higher than 0.7 but lower than 0.9.

TABLE 1

| | First intermediate layer | Second intermediate layer | Third intermediate layer | Fourth intermediate layer | Fifth intermediate layer |
|---|---|---|---|---|---|
| Si concentration (at. %) (First intermediate layer is regarded as "1") | 1 | 0.7~0.9 | 0.7~0.9 | 0.6~0.8 | 0.9~1 |
| H concentration (at. %) (First intermediate layer is regarded as "1") | 1 | 0.9~1 | 1.1~1.2 | 1~1.1 | 1~1.1 |
| Hardness ratio | 1 | 1.1~1.2 | 1~1.1 | 0.9~1.05 | 1~1.1 |
| Thickness ratio | 1 | 0.8~0.9 | 0.8~0.9 | 1.1~1.2 | 1.1~1.2 |

Figure 2:
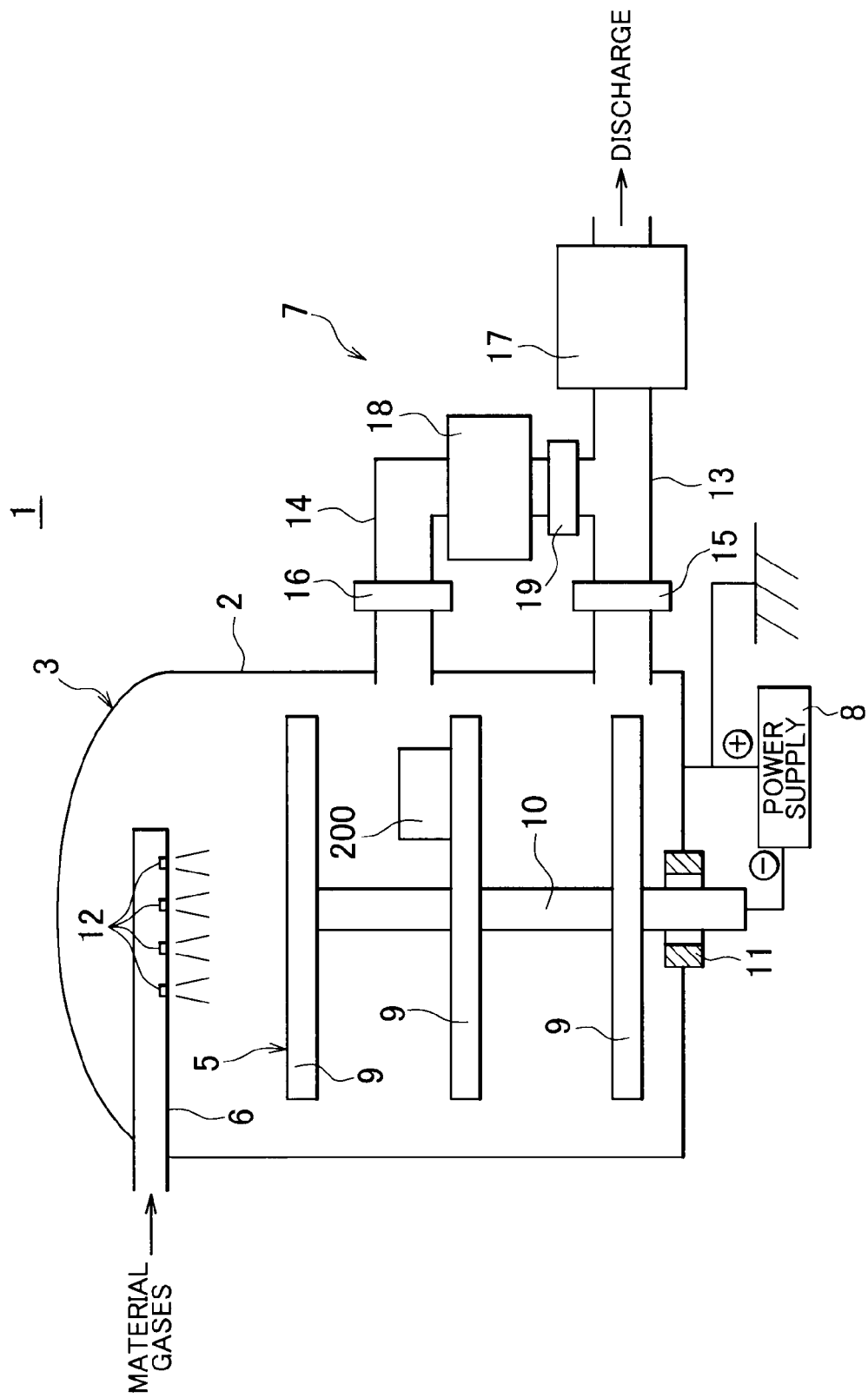
FIG. 2 is a view schematically showing the structure of a CVD system used to form a DLC film and an intermediate layer shown in FIG. 1.

FIG. 2 is a view schematically showing the structure of a CVD system 1 used to form the intermediate layer 300 and DLC film 400. The CVD system 1 includes a treatment chamber 3 defined by a partition wall 2, a base portion 5 that supports the base 200 in the treatment chamber 3, a gas delivery pipe 6 through which constituent gases (including material gases) are delivered into the treatment chamber 3, an exhaust system 7 for evacuating the treatment chamber 3, and a power supply 8 that generates direct current pulse voltage for transforming the gases delivered into the treatment chamber 3 into plasmas.

The base portion 5 has support plates 9 horizontally oriented, and a support shaft 10 that extends vertically and supports the support plates 9. In this example embodiment, the base portion 5 has a three-tier structure in which the three support plates 9 are vertically arranged in a row. The base portion 5 is entirely made of a conductive material, such as copper. The negative terminal of the power supply 8 is connected to the base portion 5. The base 200 is placed on one of the support plates 9.

The partition wall 2 that defines the treatment chamber 3 is made of a conductive material, such as stainless steel. The positive terminal of the power supply 8 is connected to the partition wall 2. The partition wall 2 is grounded. The partition wall 2 and the base portion 5 are insulated from each other by an insulator 11. Thus, the potential of the partition wall 2 is maintained at the ground potential. When the power supply 8 is turned on and direct current pulse voltage is generated, a difference in potential arises between the partition wall 2 and the base portion 5.

The gas delivery pipe 6 extends horizontally above the base portion 5 in the treatment chamber 3. A plurality of gas discharge holes 12 is formed at a portion of the gas delivery pipe 6, which faces the base portion 5. The gas discharge holes 12 are aligned in the longitudinal direction of the gas delivery pipe 6. The material gases are delivered into the treatment chamber 3 by being discharged from the gas discharge holes 12. As the constituent gases, the material gases and a carrier gas are delivered to the gas delivery pipe 6. The material gases to be delivered may be a hydrocarbon-based gas, such as methane ($CH_4$), acetylene ($C_2H_2$), benzene ($C_6H_6$), and toluene ($C_7H_8$), an organosilicon-compound-based gas, such as tetramethylsilane gas ($Si(CH_3)_4$) and siloxane, and a hydrogen gas ($H_2$). The carrier gas to be delivered may be, for example, argon (Ar). Multiple constituent gas delivery pipes (not shown in the drawings) are connected to the gas delivery pipe 6. The constituent gas delivery pipes are used to deliver the constituent gases from supply sources (e.g., gas cylinders and containers that store liquid) of the constituent gases to the gas treatment chamber 3. That is, the constituent gases are delivered to the gas delivery pipe 6 via the constituent gas delivery pipes, and then delivered into the treatment chamber 3 via the gas delivery pipe 6. Provided at each constituent gas delivery pipe are a flowrate regulation valve (not shown in the drawings) used to regulate the flowrate of the constituent gas coming form the corresponding supply source, and so on. Among the supply sources, the liquid container may be provided with heating equipment (not shown in the drawings) for heating the liquid as required.

The exhaust system 7 includes a first exhaust pipe 13 and a second exhaust pipe 14 both of which communicate with the treatment chamber 3, a first open-close valve 15, a second open-close valve 16, a third open-close valve 19, a first pump 17, and a second pump 18. The first open-close valve 15 and the first pump 17 are arranged midway at the first exhaust pipe 13 in this order from the treatment chamber 3-side. The first pump 17 may be, for example, a low-vacuum pump, such as an oil-sealed rotary vacuum pump (generally called "rotary pump") or a diaphragm vacuum pump. Note that an oil-sealed rotary vacuum pump is a positive displacement vacuum pump in which airtight spaces and wasted spaces between parts, such as a rotor, a stator, and vanes, are reduced using oil. Oil-sealed rotary vacuum pumps that may be used as the first pump 17 include, for example, sliding vane rotary vacuum pumps and rotary plunger vacuum pumps.

The downstream end of the second exhaust pipe 14 is connected to a portion of the first exhaust pipe 13, which is between the first open-close valve 15 and the first pump 17. The second open-close valve 16, second pump 18, and third open-close valve 19 are arranged midway at the second exhaust pipe 14 in this order from the treatment chamber 3-side. The second pump 18 may be a high-vacuum pump, such as a turbo-molecular pump or an oil-diffusion pump.

The gases in the treatment chamber 3 are discharged from the treatment chamber 3 by the first pump 17 and second pump 18. When the intermediate layer 300 or the DLC film 400 are formed, the gases in the treatment chamber 3 are discharged with the base 200 placed on one of the support plates 9 while the material gases are continuously delivered into the treatment chamber 3 so as to maintain the pressure in the treatment chamber 3 at a predetermined low pressure (e.g., approximately 100 to 400 Pa). In this state, a difference in potential is caused between the partition wall 2 and the base portion 5 by turning the power supply 8 on. Thus, a plasma occurs in the treatment chamber 3. As the plasma thus occurs, ions and free radicals are produced from the material gases in the treatment chamber 3, and these ions and free radicals are attracted toward the base portion 5, that is, to the surface of the base 200 due to the potential difference. DLC is accumulated on the surface of the base 200, and thus the intermediate layer 300 and DLC film 400 are formed. In this example embodiment, when the intermediate layer 300 is formed, for example, a hydrocarbon-based gas, an organosilicon-compound-based gas, and a hydrogen gas, etc. are delivered to the gas delivery pipe 6. When the DLC film 400 is formed, a hydrocarbon-based gas and a hydrogen gas are delivered to the gas delivery pipe 6. In this way, it is possible to form the intermediate layer 300 that contains Si and the DLC film 400 made exclusively of DLC.

The Si concentrations in the layers 301 to 305 are made equal to desired values by changing the ratio of the flowrate of the organosilicon-compound-based gas to the overall flowrate of all the material gases delivered to the gas delivery pipe 6 when the multiple layers 301 to 305 are formed. Further, the H concentrations in the layers 301 to 305 are made equal to desired values by changing the ratios of the flowrates of hydrocarbon-based gas and hydrogen gas used when the multiple layers 301 to 305 are formed. More specifically, the elemental ratio (molar ratio) in the constituent gases at the time of formation of the first intermediate layer 301 is, for example, C:H:Si:Ar=17.7:67.2:0.9:14.2. The elemental ratio (molar ratio) in the constituent gases at the time of formation of the second intermediate layer 302 is, for example, C:H:Si:Ar=15.5:58.9:0.7:24.9. The elemental ratio (molar ratio) in the constituent gases at the time of formation of the third intermediate layer 303 is, for example, C:H:Si:Ar=13.7:63.4:0.7:22.2. The elemental ratio (molar ratio) in the constituent gases at the time of formation of the fourth intermediate layer 304 is, for example, C:H:Si:Ar=15.5:71.3:0.7:12.5. The elemental ratio (molar ratio) in the constituent gases at the time of formation of the fifth intermediate layer 305 is, for example, C:H:Si:Ar=16.5:69.4:0.8:13.3.

The intermediate layer 300 and DLC film 400 may be formed by, for example, a plasma CVD method other than the direct current pulse plasma CVD method, such as the direct current plasma CVD method and the high-frequency plasma CVD method. Further, the intermediate layer 300 and DLC film 400 may be formed by the ion-beam spattering method, the DC (direct current) spattering method, the RF (high frequency) spattering method, or the magnetron spattering method.

Next, the example embodiment and comparative examples will be described.

First, the example embodiment will be described. A DLC-coated member was produced by forming the intermediate layer 300 shown in FIG. 1 on a base made of a high speed tool steel (SKH4) and then forming the DLC film 400 shown in FIG. 1 on the intermediate layer 300. The intermediate layer 300 and DLC film 400 were formed by the direct current pulse plasma CVD method, using the CVD system 1 shown in FIG. 2.

Next, a first comparative example will be described. A DLC-coated member was produced by forming the DLC film 400 shown in FIG. 1 directly on a base made of a high speed tool steel (SKH4). The DLC film 400 was formed by the direct current pulse plasma CVD method, using the CVD system 1 shown in FIG. 2.

Next, a second comparative example will be described. A DLC-coated member was produced by forming an intermediate layer constituted of a gradient film on a base made of a high speed tool steel (SKH4) and then forming the DLC film 400 shown in FIG. 1 on the intermediate layer. The intermediate layer and DLC film 400 were formed by the direct current pulse plasma CVD method, using the CVD system 1 shown in FIG. 2.

The composition of the intermediate layer constituted of the gradient film continuously and gradually changes toward to the DLC film 400. A delamination test was conducted on the DLC films of the DLC-coated members in the example embodiment and first and second comparative examples. The delamination test is "scratch test" that complies with the provisions of Japan Society of Mechanical Engineers Standards JSME S010 (1996). Table 2 shows the results of the delamination test conducted on the DLC-coated members in the example embodiment and first and second comparative examples.

TABLE 2

| | | Adhesion (N) |
|---|---|---|
| First Comparative Example | Without intermediate layer | 9.6 |
| Second Comparative Example | Gradient intermediate layer | 18.0 |
| Example Embodiment | Five-layer intermediate layer | 27.6 |

The delamination load (note that "Adhesion" in Table 2 may alternatively be termed "Critical Delamination Load") of the DLC film (the DLC film 400) in the example embodiment is 27.6 N. The delamination loads of the DLC films of the first and second comparative examples are 9.6 N and 18.0 N, respectively. This shows that the DLC-coated member according to the example embodiment achieves an excellent adhesion between the DLC film and the base. According to the example embodiment, as described above, the intermediate layer 300 has a multi-layer structure. Each of the layers 301 to 305 included in the intermediate layer 300 is made of DLC to which Si has been added. Further, the third intermediate layer 303 is sandwiched between the first intermediate layer 301 and the fifth intermediate layer 305 both of which are higher in Si concentration than the third intermediate layer 303.

When Si is added to DLC, the number of covalent bonds in the DLC decreases and the DLC thus becomes relatively soft. Further, the higher the Si concentration in DLC is, the softer the DLC is. Because the layers 301 to 305 are each made of DLC to which Si has been added, the intermediate layer 300 that is relatively soft is obtained. If the intermediate layer 300 is soft, internal stresses in the DLC film 400 are absorbed by the intermediate layer 300. Thus, a high adhesion of the DLC film 400 to the base 200 is achieved.

The intermediate layer 300 has the five-layer structure. Therefore, even if a crack occurs at a part of the intermediate layer 300, development of the crack is suppressed. Thus, the intermediate layer 300 that has a high crack resistance is obtained. However, if all the layers 301 to 305 that constitute the intermediate layer 300 are soft, the rigidity of the intermediate layer 300 may be lowered, resulting in reduction of the adhesion of the DLC film 400.

To address this problem, in the DLC-coated member 100 according to the example embodiment, the third intermediate layer 303 is sandwiched between the first intermediate layer 301 and the fifth intermediate layer 305, both of which are higher in Si concentration than the third intermediate layer 303. Thus, reduction of the entire rigidity of the intermediate layer 300 is prevented. Thus, it is possible to achieve a high adhesion of the DLC film 400 to the base 200 while maintaining the appropriate entire rigidity of the intermediate layer 300.

The H concentration (amount of hydrogen contained) in the third intermediate layer 303 is higher than the H concentrations (amounts of hydrogen contained) in the first intermediate layer 301 and fifth intermediate layer 305. The higher the H concentration in DLC is, the softer the DLC is. Thus, internal stresses in the DLC film 400 are further effectively absorbed by the intermediate layer 300, resulting in a further increase in the adhesion of the DLC film 400 to the base 200.

Figure 3:
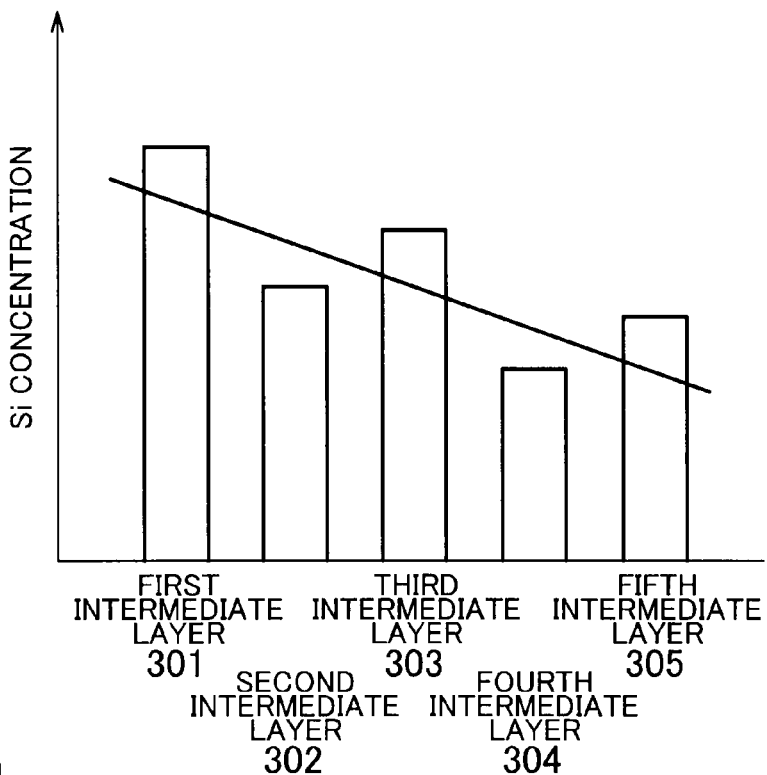
FIG. 3 is a graph schematically showing the Si concentration distribution in an intermediate layer of a DLC-coated member according to another example embodiment of the invention.
Figure 4:
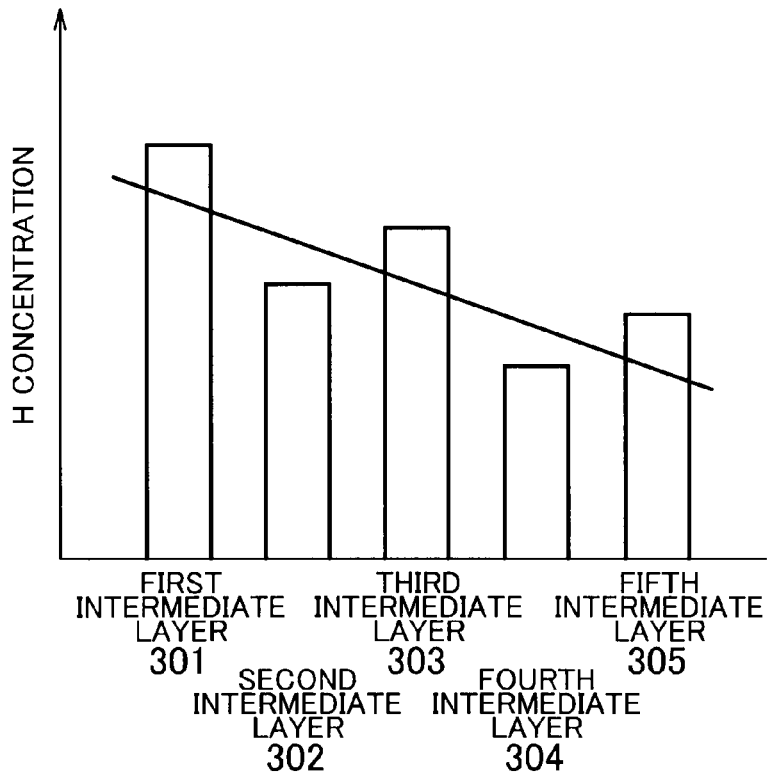
FIG. 4 is a graph schematically showing the H concentration distribution in the intermediate layer of the DLC-coated member shown in FIG. 3.

A second example embodiment will be described below. FIG. 3 is a graph schematically showing the Si concentration distribution in the intermediate layer 300 of a DLC-coated member 1 according to the second example embodiment of the invention. FIG. 4 is a graph schematically showing the H concentration distribution in the intermediate layer 300 of the DLC-coated member 1 according to the same example embodiment. The Si and H concentrations in the layers 301 to 305 constituting the intermediate layer 300 in the example embodiment shown in FIGS. 3 and 4 are different from those in the example embodiment shown in FIG. 1.

As shown in FIG. 3, the Si concentration in the first intermediate layer 301 is higher than the Si concentration in the second intermediate layer 302 next to the first intermediate layer 301. The Si concentration in the third intermediate layer 303 is higher than each of the Si concentrations in the second intermediate layer 302 and fourth intermediate layer 304 on respective sides of the third intermediate layer 303. The Si concentration in the fifth intermediate layer 305 is higher than the Si concentration in the fourth intermediate layer 304 next to the fifth intermediate layer 305. In other words, the layers 301, 303, and 305 each having a relatively high Si concentration and the layers 302 and 304 each having a relatively low Si concentration are alternately laminated. Further, with regard to the first, third and fifth intermediate layers 301, 303, and 305, the Si concentration in the third intermediate layer 303 is lower than that in the first intermediate layer 301 and the Si concentration in the fifth intermediate layer 305 is lower than that in the third intermediate layer 303, that is, the Si concentration decreases in the direction away from the surface of the base 200. With regard to the second and fourth layers 302 and 304, the Si concentration in the fourth intermediate layer 304 is lower than that in the second intermediate layer 302, that is, the Si concentration decreases in the direction away from the surface of the base 200.

As shown in FIG. 4, the H concentration in the first intermediate layer 301 is higher than the H concentration in the second intermediate layer 302 next to the first intermediate layer 301. The H concentration in the third intermediate layer 303 is higher than each of the H concentrations in the second intermediate layer 302 and fourth intermediate layer 304 on respective sides of the third intermediate layer 303. The H concentration in the fifth intermediate layer 305 is higher than the H concentration in the fourth intermediate layer 304 next to the fifth intermediate layer 305. In other words, the layers 301, 303, and 305 each having a relatively high H concentration and the layers 302 and 304 each having a relatively low H concentration are alternately laminated. Further, with regard to the first, third and fifth intermediate layers 301, 303 and 305, the H concentration in the third intermediate layer 303 is lower than that in the first intermediate layer 301 and the H concentration in the fifth intermediate layer 305 is lower than that in the third intermediate layer 303, that is, the H concentration decreases in the direction away from the surface of the base 200. With regard to the second and fourth intermediate layers 302 and 304, the H concentration in the fourth intermediate layer 304 is lower than that in the second intermediate layer 302, that is, the H concentration decreases in the direction away from the surface of the base 200.

In the case described above, a combination of the first intermediate layer 301, second intermediate layer 302, and third intermediate layer 303, a combination of the second intermediate layer 302, third intermediate layer 303, and fourth intermediate layer 304, and a combination of the third intermediate layer 303, fourth intermediate layer 304, and fifth intermediate layer 305 may each be selected as a combination of "first layer", "second layer", and "third layer". While the invention has been described with reference to the two example embodiments, the invention may be implemented in various other embodiments.

In the first example embodiment, the Si concentration in any one of the second intermediate layer 302, third intermediate layer 303, and fourth intermediate layer 304 may be higher than each of the Si concentrations in the first intermediate layer 301 and fifth intermediate layer 305. Further, while the third intermediate layer 303 is regarded as "second layer" in the first example embodiment, if the second intermediate layer 302 is alternatively regarded as "second layer", it can be said that the H concentration in "second layer" is lower than each of the H concentrations in the first intermediate layer 301 and fifth intermediate layer 305.

While the intermediate layer 300 having a five-layer structure has been described in the foregoing example embodiments, the intermediate layer may alternatively be constituted of three layers, four layers, or six or more layers. Further, a gradient film in which the composition continuously and gradually changes in the direction away from the surface of the base 200 may be formed in the intermediate layer 300 at a portion next to the boundary with the surface of the base 200. While a DLC film, to which no other element has been added, has been described as the DLC film 400 by way of example, a DLC film, to which at least one of Fe (iron), Si, Co (cobalt), and Ti (Titanium) has been added, may be used.

It is to be understood that various design modifications may be made within the scope of the claims.

What is claimed is:

1. A DLC-coated member having a base of which a surface is coated, at least partially, with a DLC film, comprising:
    an intermediate layer that is formed between the base and the DLC film,
    wherein the intermediate layer has a multi-layer structure formed by laminating three or more layers that are made of DLC to which a predetermined element has been added,
    wherein the three or more layers include a first layer, a second layer, and a third layer that are formed in this order from the base side, and
    wherein each of an amount of the added element in the first layer and an amount of the added element in the third layer is higher or lower than an amount of the added element in the second layer,
    wherein the amount of the added element contained in the first layer is larger than the amount of the added element contained in the third layer.

2. A DLC-coated member having a base of which a surface is coated, at least partially, with a DLC film, comprising:
    an intermediate layer that is formed between the base and the DLC film,
    wherein the intermediate layer has a multi-layer structure formed by laminating three or more layers that are made of DLC to which a predetermined element has been added,
    wherein the three or more layers include a first layer, a second layer, and a third layer, a fourth layer and a fifth layer that are formed in this order from the base side, wherein
    an amount of the added element contained in the second layer is smaller than each of an amount of the added element contained in the first layer and an amount of the added element contained in the third layer,
    the amount of the add element contained in the first layer is larger than the amount of the added element contained in the third layer,
    an amount of the added element contained in the fourth layer is smaller than each of an amount of the added element contained in the third layer and an amount of the added element contained in the fifth layer,
    the amount of the add element contained in the third layer is larger than the amount of the added element contained in the fifth layer.

3. The DLC-coated member according to claim 1, wherein the added element is hydrogen.

4. The DLC-coated member according to claim 2, wherein the added element is hydrogen.

5. The DLC-coated member according to claim 1, wherein the added element is silicon.

6. The DLC-coated member according to claim 2, wherein the added element is silicon.

* * * * *